United States Patent
Takahashi et al.

(10) Patent No.: US 8,822,966 B2
(45) Date of Patent: Sep. 2, 2014

(54) NONVOLATILE MEMORY DEVICE

(71) Applicant: Kabushiki Kaisha Toshiba, Tokyo (JP)

(72) Inventors: Kensuke Takahashi, Kanagawa (JP); Masanobu Baba, Kanagawa (JP); Yusuke Arayashiki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/770,463

(22) Filed: Feb. 19, 2013

(65) Prior Publication Data

US 2014/0008603 A1    Jan. 9, 2014

(30) Foreign Application Priority Data

Jul. 9, 2012    (JP) .................. 2012-153853

(51) Int. Cl.
    *H01L 29/00*    (2006.01)
(52) U.S. Cl.
    USPC .................. 257/1; 257/5
(58) Field of Classification Search
    CPC .................. H01L 45/085
    USPC .................. 257/1, 4, 5
    See application file for complete search history.

(56) References Cited

U.S. PATENT DOCUMENTS

| | | | |
|---|---|---|---|
| 7,382,647 B1 | 6/2008 | Gopalakrishnan | |
| 7,423,906 B2 | 9/2008 | Symanczyk | |
| 7,804,704 B2 | 9/2010 | Sousa | |
| 8,279,657 B2 | 10/2012 | Takagi et al. | |
| 2011/0068315 A1* | 3/2011 | Nakajima | 257/4 |
| 2011/0068316 A1* | 3/2011 | Takano et al. | 257/4 |
| 2011/0175049 A1 | 7/2011 | Yasuda et al. | |
| 2011/0176351 A1* | 7/2011 | Fujitsuka et al. | 365/148 |
| 2011/0194329 A1* | 8/2011 | Ohba et al. | 365/148 |

FOREIGN PATENT DOCUMENTS

JP    2011-151085    8/2011

OTHER PUBLICATIONS

Jubong Park et al., Improved Switching Variability and Stability by Activating a Single Conductive Filament, IEEE Electron Device Letters, 2012, 3 pages.

* cited by examiner

*Primary Examiner* — Yu-Hsi D Sun
(74) *Attorney, Agent, or Firm* — Patterson & Sheridan, LLP

(57) ABSTRACT

A nonvolatile memory device has a memory cell including a resistance change layer, a first electrode, and a second electrode. The resistance change layer switches between high and low resistance states due to the transfer of metal ions from the first electrode in response to voltages applied between the electrodes. The first electrode is formed on a first side of the resistance change layer, and provides metal ions. The second electrode is formed on a second side of the resistance change layer. A memory cell region is formed between the first electrode and the second electrode with the resistance change layer. The memory device also includes a high permittivity layer with a higher dielectric constant than the resistance change layer.

15 Claims, 7 Drawing Sheets

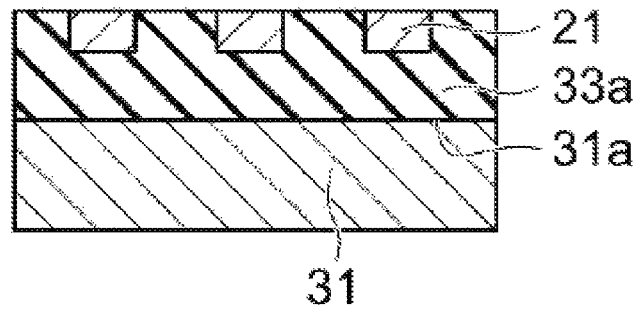
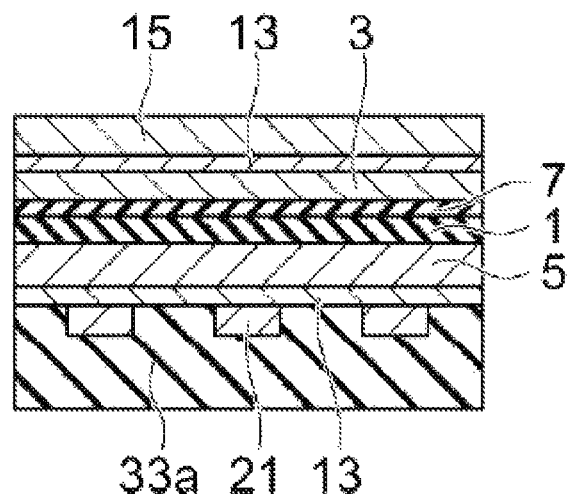
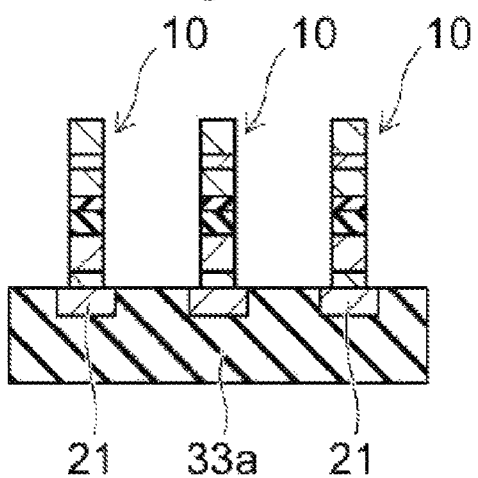

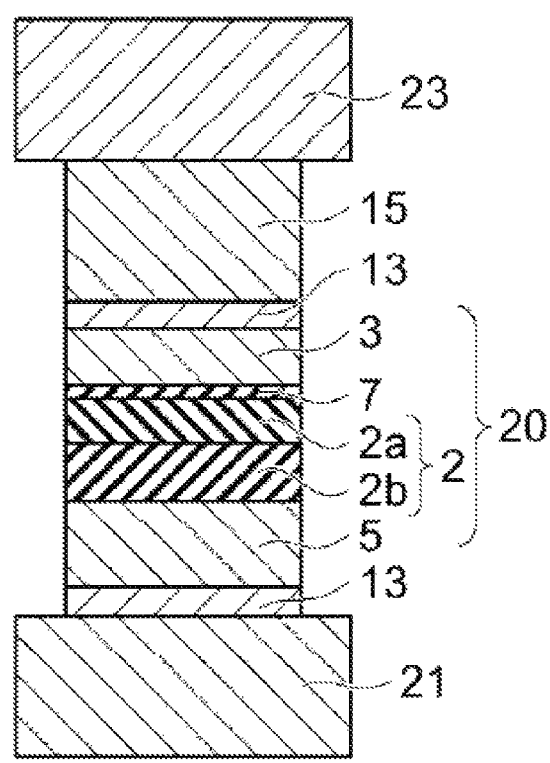

NONVOLATILE MEMORY DEVICE

CROSS-REFERENCE TO RELATED APPLICATION

This application is based upon and claims the benefit of priority from Japanese Patent Application No. 2012-153853, filed Jul. 9, 2012; the entire contents of which are incorporated herein by reference.

FIELD

Embodiments described herein relate a nonvolatile memory device.

BACKGROUND

A cross-point memory device which includes a variable resistive element has potential for realizing a nonvolatile memory device with a high storage density. These memory devices store information by setting the data to correspond with the resistance value of a variable resistive element. For example, Phase Change Random Access Memory (PCRAM) stores data by causing a phase change material in a storage medium from a crystalline condition (Conductor) to an amorphous state (Insulator), thus, altering a resistance value of the material. A Resistive RAM Memory (ReRAM) writes data by altering the resistance value of a transition metal oxide whose resistance changes when a voltage is applied. A Conductive Bridging RAM (CBRAM) operates by changing a resistance value in a storage medium by bridging an insulating layer between electrodes by the reduction of metal ions. Other memory types are also known.

Among its advantages, a CBRAM is generally composed of the same materials as a standard semiconductor memory device (e.g., NAND Flash) and also shares a common manufacturing process with standard semiconductor devices. Furthermore, the CBRAM requires very little writing current and deleting current in operation, and has good data retention properties. For these reasons, it is expected to be appropriate as a memory cell for a cross-point memory device having a high storage capacity. However, the CBRAM suffers the disadvantage of an increasing leakage current when the reduction of metal ions becomes excessive in the resistance switching (change) layer. Also, if the resistance switching layer is made thicker to reduce the leakage current, the writing (set) voltage will increase.

DESCRIPTION OF THE DRAWINGS

FIGS. 4A-4C, 5A-5B, and 6 are schematic cross sections depicting the manufacturing process of the nonvolatile memory device of the first embodiment.

FIG. 7 is a schematic drawing depicting a memory cell according to a second embodiment.

DETAILED DESCRIPTION

This disclosure describes as an embodiment a cross-point type nonvolatile memory that operates stably at a low voltage. In general, an example will be described with reference to the figures. Here, the parts in the figures are denoted with the same numbers when in common, and detailed explanations are omitted when appropriate.

The nonvolatile memory device of this embodiment is equipped with a memory cell including a resistance change layer, a first electrode, and a second electrode. The resistance change layer switches between two states, between high and low resistance states, by the transfer of metal ions. The first electrode is formed on a first surface of the resistance change layer and provides metal ions. The second electrode is formed on a second surface of the resistance change layer. Further, the memory cell is formed between the first electrode and the resistance change layer. The memory cell includes a high permittivity layer with a permittivity higher than at least a part of the resistance change layer in proximity to the high permittivity layer.

First Embodiment

Figure 1:
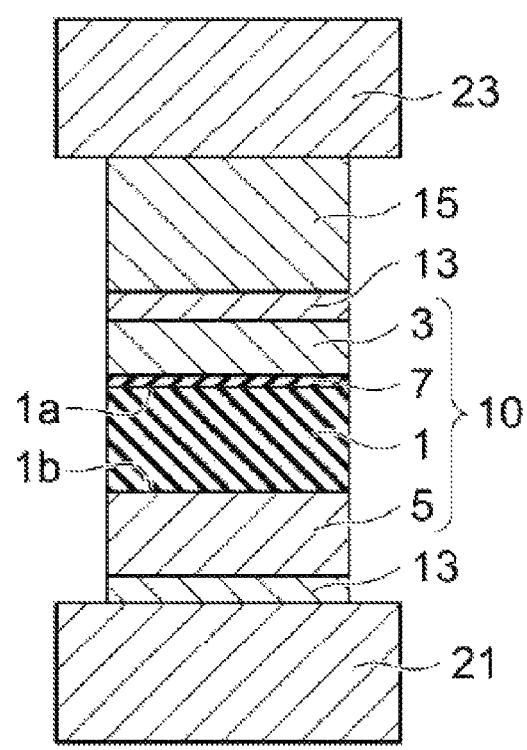
FIG. 1 is a schematic diagram showing a memory cell according to a first embodiment.

FIG. 1 is a schematic drawing showing a memory cell 10 in the first embodiment. The memory cell 10 is a variable resistive element, and is equipped with a resistance change layer 1, which switches (in a bidirectional manner), between high and low resistance states by the transfer of metal ions. An ion source electrode 3 (the first electrode) is formed on a first surface 1a of the resistance change layer 1 to provide metal ions. A counter electrode 5 (the second electrode) is formed on a second surface 1b of the resistance change layer 1 to counter the ion source electrode 3. Further, a high permittivity layer 7, which has a higher dielectric constant than at least part of the resistance change layer 1, is formed between the ion source electrode 3 and the resistance change layer 1.

The memory cell 10 is, as discussed later, positioned between a word line 21 and a bit line 23 of the cross-point type memory device. The word line 21 is connected to the counter electrode 5, through a barrier metal layer 13. The bit line 23 is connected to the ion source electrode 3, through the barrier metal 13 and a contact metal layer 15.

The ion source electrode 3 includes at least one metal element selected from the group of for example, copper (Cu), silver (Ag), aluminum (Al), cobalt (Cu) and nickel (Ni). For example, it is desirable to include Ag or Cu, which do not react with silicon (Si). Also, the ion source electrode 3 can be a mixture including other elements such as Si and W, or can have a layered structure including the above elements.

The thickness of the ion source electrode 3 is preferably between 1 nm and 10 nm. If it has a thickness of 1 nm or more, it can be installed evenly, using vacuum deposition or sputtering. Also, considering the workability in etching film stacks that include each layer, the thickness of the ion source electrode 3 is preferably less than 10 nm. Each layer is processed, for example, using Reactive Ion Etching (RIE).

For the resistance change layer 1, a material that each of the metal elements included in the ion source electrode 3, which ionize and transfer between the ion source electrode 3 and the counter electrode 5 by a voltage applied between them will be adequate. For example, any of amorphous silicon, silicon oxides, silicon nitrides, or transition metal oxides can be selected. Preferably, it should include at least one of amorphous silicon, silicon oxides, and silicon nitrides, for example, either of amorphous silicon, a silicon oxide film, or a silicon nitride film.

For example, if amorphous silicon is used, it is desirable not to add any impurities that produce a conductive carrier. Further, it is preferable to use amorphous silicon to which a small amount of oxygen (O) or nitrogen (N) is added.

The concentration of oxygen or nitrogen to be added to amorphous silicon should be, preferably, $2\times10^{20}$ atoms/cm$^3$ or more but $1\times10^{23}$ atoms/cm$^3$ or less. When it is $2\times10^{20}$ atoms/cm$^3$ or more, it is possible to suppress an excessive diffusion (or migration) of metal ions that form a filament (i.e., conduction pathway) in the resistance change layer 1. Further, when it is $2\times10^{22}$ atoms/cm$^3$ or more, the heat-resisting property can be secured during the manufacturing process. On the other hand, when it is $1\times10^{23}$ atoms/cm$^3$ or less, the adherence between the counter electrode 5 and the ion source 3 can be enhanced.

The concentrations of oxygen and nitrogen in the resistance change layer 1 can be within the above range on average, that is the oxygen and nitrogen do not have to be distributed evenly and may have various concentration profiles. For example, the concentration of oxygen can be lowest near the ion source electrode 3, and highest near the counter electrode 5, changing in distribution in increments or stages inside the amorphous silicon that lies in-between.

The thickness of the resistance change layer 1 can be set, for example, between 2 nm and 20 nm. Further, in order to keep the set current (writing current) low, the thickness of the resistance change layer should be set to less than 15 nm, preferably less than 5 nm. On the other end, to reduce the reverse current that flows from the counter electrode 5 to the ion source electrode 3, is preferable to set the thickness of the resistance change layer to higher than 3 nm.

It is desirable that the counter electrode 5 have conductivity and strong adherence with the resistance change layer 1. Preferably, a material that can be easily processed during the manufacturing process should be used. For example, semiconductors such as silicon can be used. There is no restriction as to the elements to be added to the semiconductor as impurities, but it is desirable to use n-type impurities that produce electrons as carriers. It is also preferable that, under the condition in which all the impurities are activated, the concentration of carriers falls within the range between $1\times10^{18}$ carriers/cm$^3$ and $1\times10^{20}$ carriers/cm$^3$.

The high permittivity layer 7 suppresses diffusion of the metal elements from the ion source electrode to the resistance change layer 1 in the heat load of approximately 400-500° C. Therefore, the heat diffusion coefficient of the metal element, at the high permittivity layer 7 is smaller than the diffusion coefficient of the resistance change layer 1. Also, for the high permittivity layer 7, a material with a higher permittivity than the resistance change layer 1 will be selected. Further, if the resistance change layer 1 has a multi-layered structure including multiple layers, the dielectric constant of the high permittivity layer 7 is to be set higher than that of part of the resistance change layer 1.

As a material, to be used for the high permittivity layer 7, to allow for manufacture on standard semiconductor production line, it is desirable to select, for example, a silicon nitride film (dielectric constant $\in$=7), an alumina film ($Al_2O_3$: $\in$=9.8), a hafnium oxide ($HfO_2$: $\in$=23), a yttrium oxide ($Y_2O_3$: $\in$=25), a lanthanum oxide ($La_3O_3$: $\in$=25), a titanium oxide ($TiO_2$: $\in$=40), or a tantalum oxide ($Ta_2O_5$: $\in$=25).

For example, if amorphous silicon is to be used for the resistance change layer 1, it is desirable to select either of $HfO_2$, $Y_2O_3$, $LaO_3$, $TiO_2$, or $Ta_2O_3$, which have higher dielectric constants than silicon ($\in$=12). Even more preferably, $HfO_2$ or $LaO_3$ can be selected because they have high barrier heights against the ion source electrode 3 and the resistance change layer 1 and thus suppress the leakage current produced due to tunneling.

For example, if silicon oxide film is to be used as the resistance change layer 1, it is desirable to select any of the silicon nitride films, $Al_2O$, $HfO_2$, $Y_2O_3$, $LaO_3$, $TiO_2$, or $Ta_2O_5$, which have higher dielectric constants than the silicon oxide film ($\in$=4). It is even more preferable to select any of the silicon nitride films, $Al_2O_3$, $HfO_2$, or $LaO_3$, which have high barrier heights against the ion source electrode 3, in order to suppress the leakage current produced due to tunneling.

Also, if a metallic oxide with a high dielectric constant is to be used, the high permittivity layer 7 can contain silicon within a range to allow for maintaining a higher dielectric constant than the resistance change layer 1, for example, a range of 10-50%. By this, its heat resisting property can be enhanced.

By inserting the high permittivity layer 7 between the ion source electrode 3 and the resistance change layer 1, it is possible to increase the electrical charge induced at the ion source electrode 3. In other words, during the writing operation, in which the positive voltage is applied to the ion source electrode 3, more electrons are extracted from the ion source electrode 3, compared to the cases without the high permittivity layer 7. For this reason, the charge induced at the ion source electrode 3 increases and ionization of metallic elements is promoted. By this, the number of ions that transfer from the source electrode 3 to the resistance change layer 1 increases, making it easier to form a conduction pathway (filament) inside the resistance change layer 1. As a result, it is possible to reduce the set current.

Also for the high permittivity layer 7, by selecting a material with a low heat diffusion coefficient of the metal elements for inclusion in the ion source electrode 3, it is possible to suppress the diffusion of metal elements from the ion source electrode 3 to the resistance change layer 1. Therefore, the heat-resisting property of the memory cell 10 can be enhanced.

The thickness of the high permittivity layer 7 is preferably between 1 nm and 10 nm. If the thickness of the high permittivity layer 7 exceeds 10 nm, the electric fields of the high permittivity layer 7 and the resistance change layer 1 become low, impeding ion transfer. Thus, the set current will rise. Furthermore, a thickness less than 10 nm facilitates production and increases capacitance. Therefore, it is preferable to make the high permittivity layer 7 thin within the above-stated range. On the other end, a thickness of 1 nm or more is preferred to ensure uniformity of the high permittivity layer 7.

Figure 2:
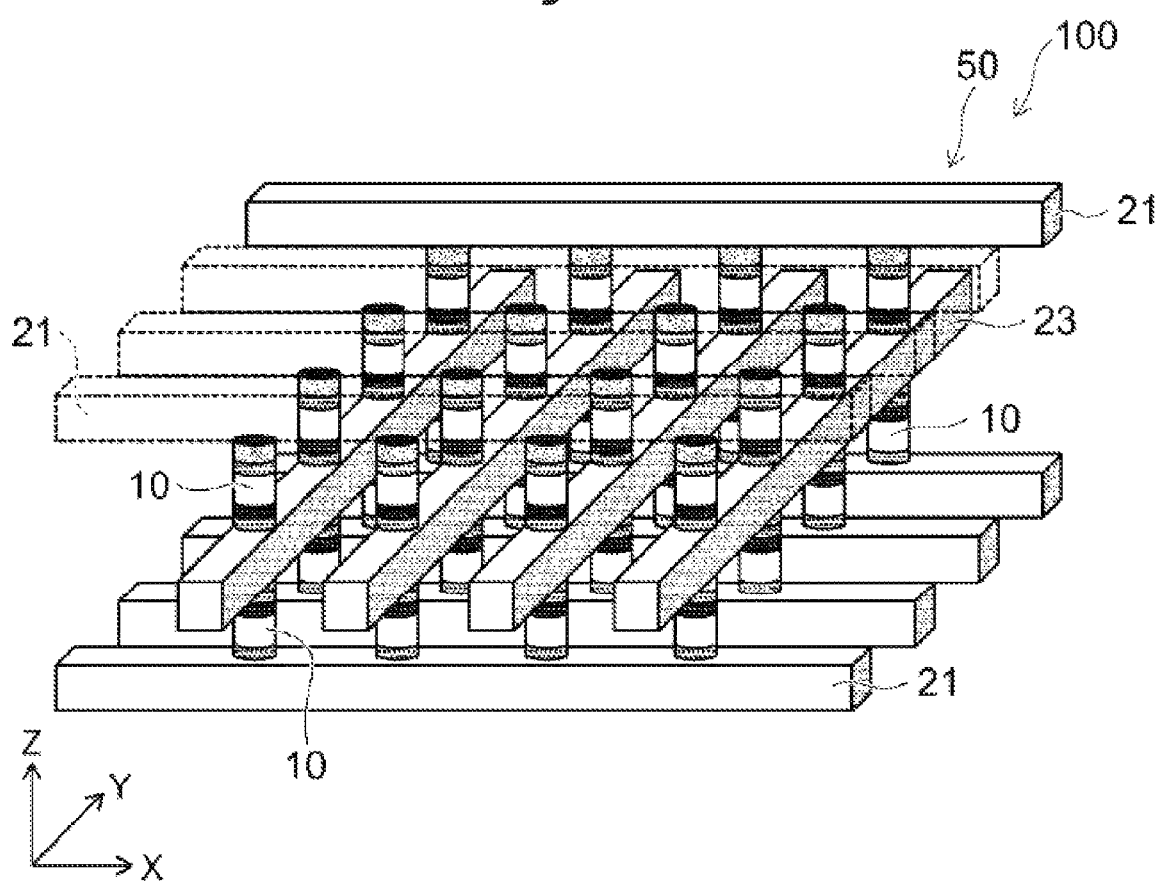
FIG. 2 is an oblique drawing schematically showing the nonvolatile memory device of the first embodiment.

FIG. 2 is an oblique drawing schematically depicting the memory cell array part 50 of nonvolatile memory device 100 according to the first embodiment. Nonvolatile memory device 100 is a cross-point type memory device. For example, it has a substrate not shown in the figure, and is equipped with multiple-word lines 21, which extend in the first direction (X direction) on the substrate, and multiple bit lines 23, which extend in the second direction (Y direction) that intersects with the first direction. As seen in FIG. 2, at each of the crossing points of the word lines 21 and the bit lines 23, the memory cells 10 are formed between the word line 21 and the bit line 23.

Memory cell array 50 is, for example, formed on the silicon substrate. A drive circuit for memory cell array part 50 is formed on the silicon substrate. An inter-layer insulating film made of a silicon oxide film, is formed on the drive circuit. Memory cell array part 50 is also formed on the drive circuit, over the inter-layer insulating film.

Memory cell array part 50 is equipped with the word line wiring layer, in which the multiple word lines 21 are arranged along the Y-direction, and the bit line wiring layer, in which the multiple bit lines 23 are arranged along the X-direction. It has a structure in which the word wiring layers and bit wiring layers are layered in the Z-direction.

The word lines 21 and the bit lines 23 are formed, using, for example, tungsten (W). Between the multiple word lines 21, and between the multiple bit lines 23, and between the word lines 21 and the bit lines 23, inter-layer insulating films are formed to insulate lines from one another.

The memory cell 10, which has a pillar shape, and includes multiple layers layered in the Z-direction, installed at each nearest contacting point (intersection) of each word line 21 and bit line 23. In other words, the memory cell 10 is installed between the word line 21 and the hit line 23 in the Z-direction.

Memory cell array part 50, shown in FIG. 2, has a structure in which the memory cells 10 are placed in two layers. However, it is not limited to this form. It can have a structure with three or more layers, or a planar structure with only one layer.

Figure 3A:
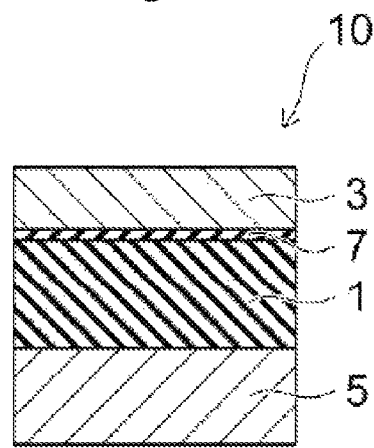
FIGS. 3A to 3C are schematic cross sections depicting the operation of the memory cell of the first embodiment.
Figure 3B:
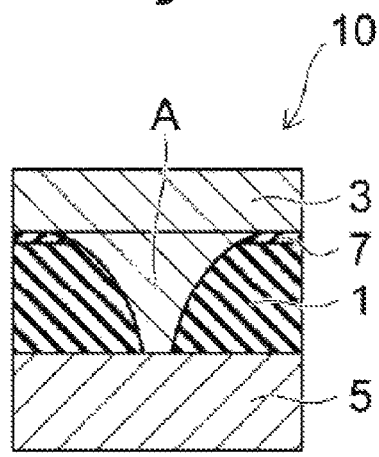
Figure 3C:
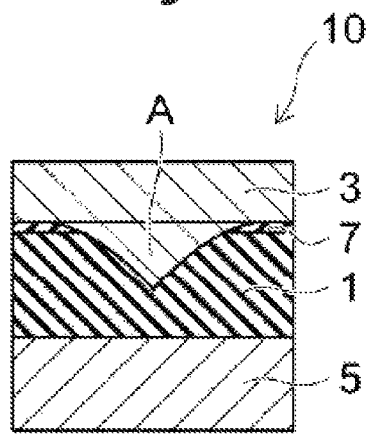

FIGS. 3A to 3C are cross sections, showing schematically the operation of the memory cell 10. FIG. 3A shows the initial state, FIG. 3B shows the on state, and FIG. 3C shows the off state.

In the initial state shown in FIG. 3A, metallic ions are not transferring from the ion source electrode 3 to the resistance change layer 1 and the high permittivity layer 7, and high resistance exists between the ion source electrode 3 and the counter electrode 5.

Next, the set voltage (writing voltage) is applied between the ion source electrode 3 and she counter electrode 5. In other words, by applying the positive voltage to the ion source electrode 3 and applying the negative voltage to the counter electrode 5, metallic ions are transferred from the ion source electrode 3 to the high permittivity layer 7 and the resistance change layer 1. By this, as shown in FIG. 3B, a conduction path (filament) A is formed, in which metallic ions are connected between the ion source electrode 3 and the counter electrode 5. With this, the area between the ion source electrode 3 and the counter electrode 5 is put into a state of low resistance (ON).

On the other hand, if a relatively high voltage in the opposite polarity to the set voltage is applied, metal ions move in the opposite direction, and as shown in FIG. 30, filament A between the ion source electrode 3 and the counter electrode 5 is broken and the area is put back into the original high resistance state (OFF). The relatively high voltage in opposite polarity to the set voltage may be called the reset voltage.

Furthermore, in the low resistant state shown in FIG. 3B, if a relatively low voltage is applied in the opposite polarity to the set voltage, metal ions move in the direction of the on source electrode 3, and filament A is broken, putting the area into a state of high resistance. On the other hand, if the voltage is applied with the same polarity as the set voltage, metal ions move in the direction of the counter electrode 5, and filament. A becomes connected, putting the area back into the state of low resistance (ON).

In this way, the memory cell 10 functions as a switching element having a rectification property. Furthermore, if the n-type semiconductor is used for the counter electrode 5, in the state in which a voltage is applied in the opposite direction to the set voltage, the area in the counter electrode 5 that comes in contact with the resistance change layer 1 becomes depleted. Because of this, electrons, which are conductive carriers, are not available at the intersection of the conduction path A and the counter electrode 5. Thus, very little current flows through filament A, making it possible to obtain a strong rectification property.

In the case where the n-type semiconductor is used for the counter electrode 5, from the standpoint of depletion, it is preferable to have low impurity concentration. However, as the impurity concentration in the semiconductor becomes lower, it tends to become more difficult to achieve consistent impurities due to difficulties with material refinement. Because of this, it is desirable to choose the semiconductor material, and impurity concentration appropriately according to the size of the memory cell.

As mentioned above, the memory cell 10 is a voltage-operation type variable resistive element, and in principle, it has a small operational current. Also, because the filament is disconnected in the off state, it has a high data retention property.

In the case where the cross-point type memory cell array part is constructed using the memory cell 10, which bears the rectification property, the rectifying device (diode), used to prevent the false (accidental) set and reset of unselected cells, can be omitted. Therefore, it becomes possible to simplify the structure of the memory cell.

Next, the production process of nonvolatile memory device 100 is explained with reference to FIG. 4A to FIG. 6. FIG. 4A to FIG. 6 are cross sections schematically showing the wafer in each process.

For example, as shown in FIG. 4A, an inter-layer insulating film 33a is constructed on a silicon substrate 31, on which the word line 21 is formed. A drive circuit, not shown here, can be formed on a surface 31a of the silicon substrate 31. In the following figures, the silicon substrate 31 will be omitted.

The inter-layer insulating film 33a is, for example, a silicon oxide film that is formed using Chemical Vapor Deposition (CVD). For the word line 21, for example, a tungsten (W) film having a thickness between 30 and 50 nm, formed by the CVD method, can be used. Also, the word line 21 is formed by processing the W film using the RIE or damascene method.

Next, as shown in FIG. 4E, the barrier metal layer 13, the counter electrode 5, the resistance change layer 1, the high permittivity layer 7, the ion source electrode 3, the barrier metal layer 13 and the contact metal layer 15 are formed in this order on the word line 21. This layered structure can be formed by using, for example, a sputtering method.

For the barrier metal layer 13, it is possible to use, for example, a metal selected from the group of ruthenium (Ru) titanium (Ti) tantalum (Ta) tungsten (W), hafnium (Hf), and Aluminum (Al), or a material, selected from their oxides or nitrides. From the standpoint, of the resistance value of the memory cell, the set voltage, and the tolerance during processing, a preferred material is TiN (titanium nitride) with thickness preferably between 5 nm and 15 nm.

Next, as shown in FIG. 4C, the memory cell 10 is formed by selectively etching the layered structure from the barrier metal layer 13 through the contact metal layer 15. For example, a mask material is formed on the above layered structure, which is, after processing into a cell-pattern by photolithography and etching by RIE into a pillar shape having a width of between 20 and 100 nm.

Figure 5A:
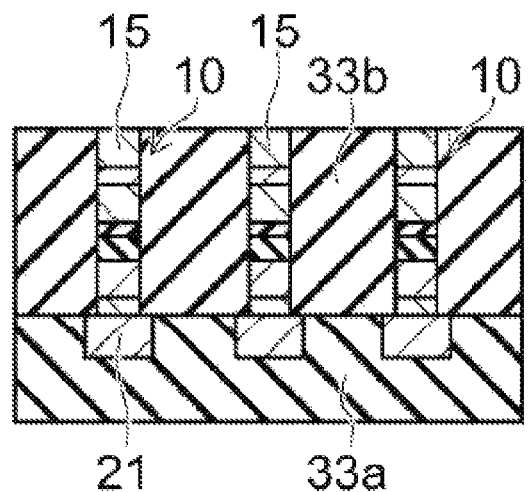

Next, as shown in FIG. 5A, an inter-layer insulating film 33b is formed between the memory cells 10. The inter-layer insulating film 33b is, for example, a silicon oxide film formed by CVD, and it is formed to have enough thickness to embed (fill spaces in) the entire memory cell 10. Furthermore, the surface of the inter-layer film 33b is planarized by the Chemical Mechanical Polish (CMP) method, and the upper surface of the contact metal layer 15 exposed. The contact metal layer 15 is generally thicker than other layers, and formed, for example, having a thickness of between 30 and 50 nm. Therefore, it is possible to expose the contact surface without damaging the memory cell 10.

Figure 5B:
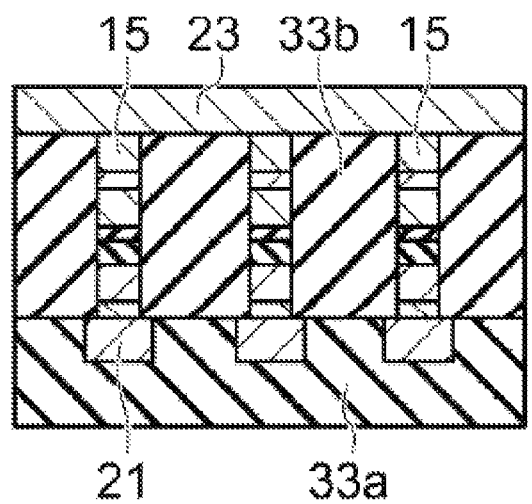

Next, as shown FIG. 5B, the bit line 23 is formed on the contact metal layer 15. For example, a tungsten (W) film is formed on the inter-layer insulating film 33b, using the CVD method, and is patterned using the RIE method. By this, the multiple bit lines 23 are formed extending on the inter-layer insulating film 33b, and contacting the contact metal layer 15. Furthermore, an inter-layer insulating film that embeds the multiple bit lines 23 is formed (not shown in the figure.)

Figure 6:
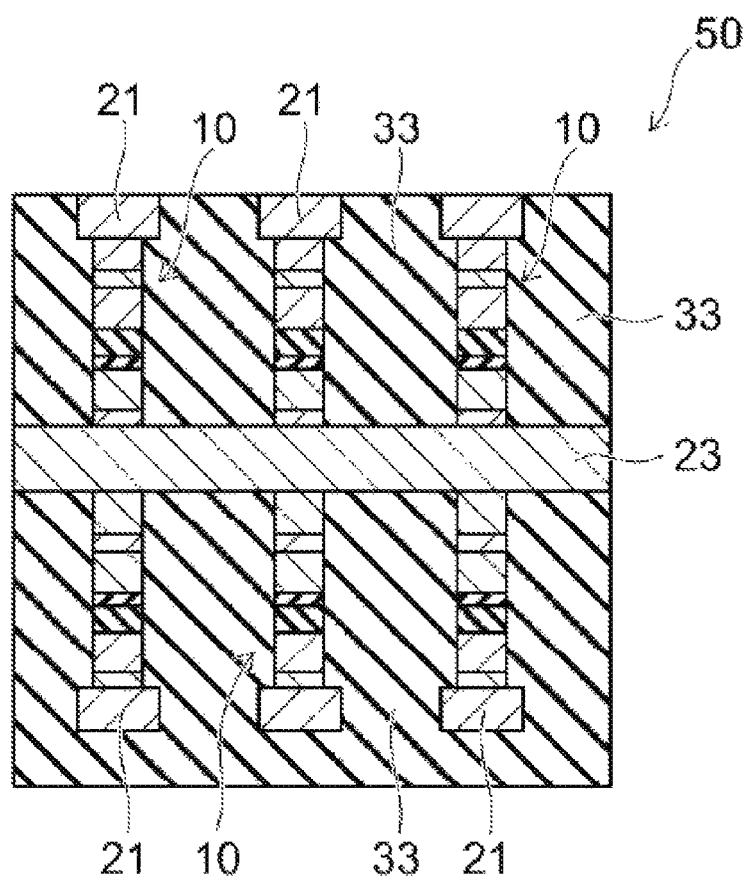

Next, as shown in FIG. 6, the second layer of memory cell array part 50 is formed. The memory cell 10, formed in this second layer, is layered in the reverse order from the memory cell 10 in first layer because the memory cells in adjacent stacked layers share the bit lines 23. In other words, the barrier metal 13, the ion source electrode 3, the high permittivity layer 7, the resistance change layer 1, the counter electrode 5, the barrier metal layer 13 and the contact metal layer 15 are layered on the bit lines 23 in this order.

Next, the above layer structure is embedded into the inter-layer insulating film 33 after processing into the pillar-shaped memory cell 10. Furthermore, the second layer of the word line 21 is formed on the contact metal layer 15, after planarization of the inter-layer insulating film 33. By this, memory cell array 50, which includes two layers of memory cells 20, is completed. In case a memory cell array part with three or more layers is to be constructed for the memory cell 10, the above process can be repeated.

In the above production process, the first layer of the memory cell 10 receives the heat load during the construction processes of the second and further layers. For example, in the case where the W film is formed using the CVD method during the construction process of the bit line 23, the memory cell 10 is heated to about 400 to 500° C. For this reason, if the heat diffusion coefficient of the metallic elements included in ion source electrode 3 is large, the metallic elements diffuse into the resistance change layer 1. As a result, the resistance in the resistance change layer 1 decreases, and sometimes the memory cell 10 does not function.

In this embodiment, by inserting the high permittivity layer 7 between the resistance change layer 1 and the ion source electrode 3, the diffusion of metallic elements from the ion source electrode 3 is suppressed. Thus, it is possible to enhance the heat tolerance of the memory cell 10 and stabilize its operation.

On the other hand, the memory cell 10 operates by transferring ionized metallic elements to resistance change layer using the voltage applied between the ion source electrode 3 and the counter electrode 5. Therefore, inserting a layer which suppresses the heat diffusion of metallic elements between the ion source electrode 3 and the resistance change layer 1 also generally impedes the transfer of ionized metallic elements from the ion source electrode 3 to the resistance change layer 1. For this reason, unfavorable effects for the operation of the memory cell 10, such as the increase in the writing voltage, are expected to occur with increased high permittivity layer 7.

Insertion of a thin layer with a small heat diffusion coefficient of the metallic element between the ion source electrode 3 and the resistance change layer 1 does not significantly increase the writing voltage, but rather stabilize the operation of the memory cell and solves the above problem. Furthermore, the set voltage can be reduced by insertion of the high permittivity layer 7 hearing a higher dielectric constant than the resistance change layer 1.

Therefore, this embodiment can implement a cross-point type memory device that operates stably at a low voltage by enhancing the heat tolerance of the memory cell 10 using the layered structure with the ion source electrode 3, the high permittivity layer 7, the resistance change layer 1 and the counter electrode 5. Furthermore, the decrease in the writing voltage reduces the number of defective cells (defective bits) when the memory cell 10 is made smaller. Thus, the production yield of the memory device can be improved.

Second Embodiment

FIG. 7 is a cross section showing the memory cell 20 according to a second embodiment. Resistance change layer 2 of the memory cell 20 includes resistance change layer 2a (the first layer), which is installed in contact with the high permittivity layer 7, and resistance change layer 2b (the second layer), which is installed between the counter electrode 5 and resistance change layer 2a. The mobility of metal ions at resistance change layer 2b is greater than the mobility at resistance change layer 2a. Also, the high permittivity layer 7 has a higher dielectric constant than resistance change layer 2a.

As shown in FIG. 7, the memory cell 20 includes the counter electrode 5, which is installed on the word line 21 through the barrier metal layer 13, resistance change layer 2b, resistance change layer 2a, the high permittivity layer 7 and the ion source electrode 3. The barrier metal layer 13 and the contact metal layer 15 are installed between the memory cell 20 and the bit line 23. Except for resistance change layer 2, the material and thickness of each layer are the same as those of the first embodiment. Their effects are also the same.

This embodiment intends to improve the property of the memory cell 20 by dividing resistance change layer 2 into one layer to sustain the state of low resistance, and another layer to produce the rectification property. In other words, resistance change layer 2a sustains the state of low resistance by maintaining filament A against the opposite bias of the writing voltage (See FIGS. 3A to 3C). On the other hand, at resistance change layer 2b, when a bias opposite to that of the writing voltage is applied, metal ions move toward the ion source electrode 3, separating filament A and the counter electrode 5. Thus, it is possible to suppress the reverse bias voltage that flows into the ion source electrode 3 from the counter electrode 5 and to retain the rectification property.

It is desirable that the mobility of metal ions forming the filament is smaller in resistance change layer 2a than in resistance change layer 2b. Furthermore, in order to enhance the heat tolerance of the memory cell 20, it is preferable that the diffusion coefficient of metallic elements in resistance change layer 2a is smaller than in resistance change layer 2b. For example, resistance change layer 2a includes at least one of a silicon oxide or a silicon nitride and resistance change layer 2b includes amorphous silicon.

Resistance change layer 2b can include oxygen or nitrogen, preferably in a concentration of $2 \times 10^{20}$ atoms/cm$^3$ to retain the rectification property. It is preferable that the thickness of resistance change layer 2, which includes resistance change layer 2a and resistance change layer 2b, be between 2 nm and 20 nm. Furthermore, it is more preferable that the thickness be 15 nm or less in order to reduce the writing voltage and even more preferable still that it be 10 nm or less.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device with a memory cell, the memory cell comprising:
   a resistance change layer, that switches between a high resistance state and a low resistance state by transfer of metal ions;
   a first electrode formed on a first side of the resistance change layer;
   a second electrode formed on a second side of the resistance change layer; and
   a high permittivity layer formed between the first electrode and the resistance change layer, the high permittivity layer having a higher dielectric constant than at least some portion of the resistance change layer,
   wherein the first electrode transfers metal ions to the resistance change layer in response to an applied voltage,
   the resistance change layer comprises:
      a first layer in contact with the high permittivity layer; and
      a second layer between the second electrode and the first layer, the second layer having a higher mobility of metal ions than the first layer and a higher dielectric constant than the first layer, and
   the first layer includes at least one of silicon oxide and silicon nitride, and
   the second layer includes amorphous silicon.

2. The nonvolatile memory device according to claim 1, wherein the high permittivity layer includes at least one of $Al_2O_3$, $HfO_2$, $Y_2O_3$, $La_2O_3$, $TiO_2$, and $Ta_2O_5$.

3. The nonvolatile memory device according to claim 1, wherein the first electrode includes at least one of Cu, Ag, Al, Co, and Ni.

4. The nonvolatile memory device according to claim 1, wherein, the second electrode includes an n-type semiconductor.

5. The nonvolatile memory device according to claim 1, further comprising:
   multiple word lines extending in a first direction; and
   multiple bit lines extending in a second direction, which intersects with the first direction;
   wherein the memory cell is formed between word lines and bit lines at each intersection of the word lines and the bit lines.

6. The nonvolatile memory device according to claim 1, wherein the second electrode comprises silicon with n-type impurities and a concentration of carriers between $1 \times 10^{18}/cm^3$ and $1 \times 10^{22}/cm^3$.

7. The nonvolatile memory device according to claim 1, wherein the resistance change layer is between 2 nm and 20 nm in thickness.

8. The nonvolatile memory device according to claim 1, wherein the resistance change layer is less than 5 nm and greater than 3 nm in thickness.

9. The nonvolatile memory device according to claim 1, wherein the second layer of the resistance change layer comprises amorphous silicon and one of oxygen and nitrogen.

10. The nonvolatile memory device of claim 9, wherein the concentration of the one of oxygen and nitrogen in the amorphous silicon is more than $2 \times 10^{22}$ atoms/$cm^3$ and less than $1 \times 10^{23}$ atoms/$cm^3$.

11. A nonvolatile memory device, comprising:
   a resistance change layer, that switches between a high resistance state and a low resistance state by transfer of metal ions;
   a first electrode formed on a first side of the resistance change layer;
   a second electrode formed on a second side of the resistance change layer; and
   a high permittivity layer formed between the first electrode and the resistance change layer, the high permittivity layer having a higher dielectric constant than at least some portion of the resistance change layer;
   a bit line extending in a first direction and electrically contacting the first electrode; and
   a word line extending in a second direction that intersects the first direction and electrically contacting the second electrode;
   wherein the first electrode transfers metal ions to resistance change layer in response to a voltage applied between the bit line and the word line,
   the resistance change layer comprises a first layer and a second layer, the first layer contacting the high permittivity layer and the second layer contacting second electrode,
   the first layer includes at least one of silicon oxide and silicon nitride, and
   the second layer includes amorphous silicon.

12. The nonvolatile memory device of claim 11, further comprising:
   a first metal barrier layer between the first electrode and the bit line; and
   a second metal barrier layer between the second electrode and the word line.

13. The nonvolatile memory device of claim 11, further comprising:
   another first electrode layer electrically connected to the bit line and formed above the bit line;
   another resistance change layer formed above the another first electrode layer; and
   another second electrode layer formed above the another resistance change layer.

14. A method of fabricating a nonvolatile memory device, the method comprising:
   forming an interlayer insulating film on a silicon substrate;
   forming a word line in the interlayer insulating film;
   depositing a counter electrode layer above the word line and the interlayer insulating film;
   depositing a resistance change layer above the counter electrode layer;
   depositing a high permittivity layer above the resistance change layer;
   depositing a ion source electrode above the high permittivity layer;
   patterning the counter electrode layer, the resistance change layer, the high permittivity layer, and the ion source electrode to form a pillar structure;
   embedding the pillar structure in an insulating film;
   planarizing the insulating film; and
   forming a bit line above the pillar structure,
   wherein the resistance change layer includes a first layer contacting the high permittivity layer and a second layer,
   the first layer includes at least one of silicon oxide and silicon nitride, and
   the second layer includes amorphous silicon.

15. The method of claim 14, wherein a plurality of word lines are formed in the interlayer insulating film, and the patterning of the counter electrode layer, the resistance change layer, and the ion source electrode to form the pillar structure forms a plurality of pillar structures.

* * * * *